United States Patent [19]

Buckland et al.

[11] Patent Number: 4,792,913

[45] Date of Patent: Dec. 20, 1988

[54] SIMULATOR FOR SYSTEMS HAVING ANALOG AND DIGITAL PORTIONS

[75] Inventors: Dennis J. Buckland, Bethpage; Robert B. DeRobertis, Maspeth, both of N.Y.

[73] Assignee: Grumman Aerospace Corporation, Bethpage, N.Y.

[21] Appl. No.: 926,642

[22] Filed: Nov. 3, 1986

[51] Int. Cl.$^4$ .............................................. G06J 1/00
[52] U.S. Cl. ..................................... 364/602; 364/801
[58] Field of Search .............. 364/600, 601, 602, 200, 364/900, 801, 578, 300; 371/20, 23

[56] References Cited

U.S. PATENT DOCUMENTS

| | | | |
|---|---|---|---|
| 3,263,066 | 7/1966 | Seegmiller | 364/600 |
| 3,505,512 | 4/1970 | Fricke, Jr. et al. | 364/801 |
| 3,551,891 | 12/1970 | Hermes et al. | 364/578 |
| 3,702,011 | 10/1972 | Armstrong | 364/300 |
| 3,863,270 | 1/1975 | Haley | 364/600 |
| 3,886,330 | 5/1975 | Egolston | 364/600 |
| 3,886,332 | 5/1975 | Petit | 364/600 |
| 3,898,439 | 8/1975 | Reed | 364/600 |
| 3,898,625 | 8/1975 | Lamden | 364/600 |
| 3,903,399 | 9/1975 | Enns | 364/600 |
| 3,903,402 | 9/1975 | Petit | 364/600 |
| 3,909,597 | 9/1975 | Dunn | 364/600 |
| 3,947,675 | 3/1976 | Mayn | 364/600 |
| 3,961,250 | 6/1976 | Snethen | 371/20 |
| 4,217,652 | 8/1980 | Klaus | 364/601 |
| 4,228,537 | 10/1980 | Henckels | 371/23 |
| 4,342,093 | 7/1982 | Miyoshi | 364/578 |
| 4,527,249 | 7/1985 | Van Brunt | 364/578 |

OTHER PUBLICATIONS

G. Korn et al "Analog/Hybrid Computation and Digital Simulation", IEEE Transactions on Computers, vol. C-25, No. 12, Dec. 1976, pp. 1312-1320.
G. Mancini et al., "Camus—A Mixed-Mode Network Analysis Program", IEEE ICCC, 1982, pp. 176-179.
A. W. Herzog, "Pulsed Analog Computer for Simulation of Aircraft", Proceedings of the IRE, 1959, pp. 847-851.
D. J. Brown et al., "Method for Simulation and Testing of Analogue/Digital Circuits", IBM Technical Disclosure Bulletin, vol. 25, No. 12, May 1983, pp. 6367-6368.
J. Werner et al., "A System Engineer's Guide to Simulators", VLSI Design, vol. 5, No. 2, Feb., 1984, pp. 27-31.
P. Wallich, "A Review of Engineering Workstations", IEEE Spectrum, Oct., 1984, pp. 48-53.
H. DeMan et al., "Diana as a Mixed-Mode Simulator for MOSLSI Sampled-Data Circuits" Proc. IEEE ISACS, 1980, pp. 435-438.
C. F. Chen et al. "The Second Generation MOTIS Timing Simulator-An Efficient and Accurate Approach for General MOS Circuits", Proc. IEEE ISCAS, 1980, pp. 538-542.
A. deGeus, "Specs: Simulation Program for Electronic Circuits and Systems", Proc. IEEE ISCAS, 1984, pp. 534-537.
H. DeMan et al., "Hybrid Simulation", Proc. IEEE ISCAS, 1979, pp. 249-252.
W. VanBokhoven, "Mixed-Level and Mixed Mode Simulation by a Piecewise-Linear Approach" Proc. IEEE ISCAS, 1982, pp. 1256-1258.
K. Sakallah et al., "Samson An Event Driven VLSI Circuit Simulation", Proc IEEE CICC, 1984, pp. 226-231.

Primary Examiner—Michael R. Fleming
Attorney, Agent, or Firm—Richard G. Geib; Daniel J. Tick; Bernard S. Hoffman

[57] ABSTRACT

An apparatus for simulating, in an engineering workstation (EW) environment, the operation of circuits or systems having analog and digital portions. Information concerning the system or circuit is acquired with input devices such as a keyboard or mouse with the aid of a display and schematic capture programs. An analog simulator and a digital simulator are present in the EW. A first data extraction program extracts selected analog data from the analog simulator. A first conversion program converts the selected analog data into digital values. A first data insertion program provides the digital values as input (forcing functions) to the digital simulator. A second data extraction program extracts selected digital analysis data from the digital simulator. A second conversion program converts the selected digital data to analog data. A second data insertion program supplies the analog data as input to the analog simulator. Selected portions of the analysis produced by either of the simulators may be presented on the display or a hard copy made by a printer.

28 Claims, 14 Drawing Sheets

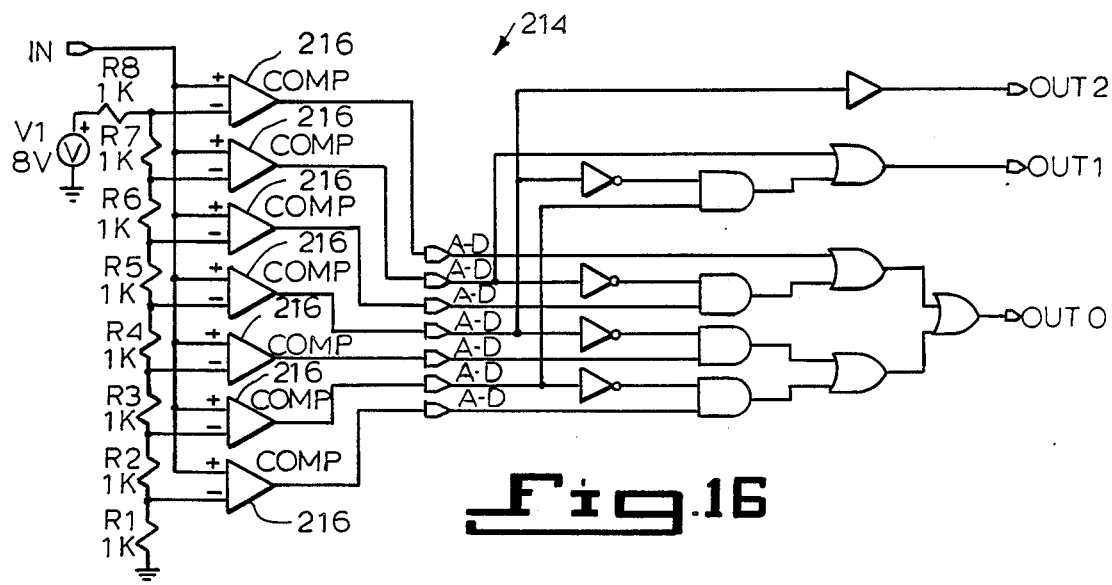
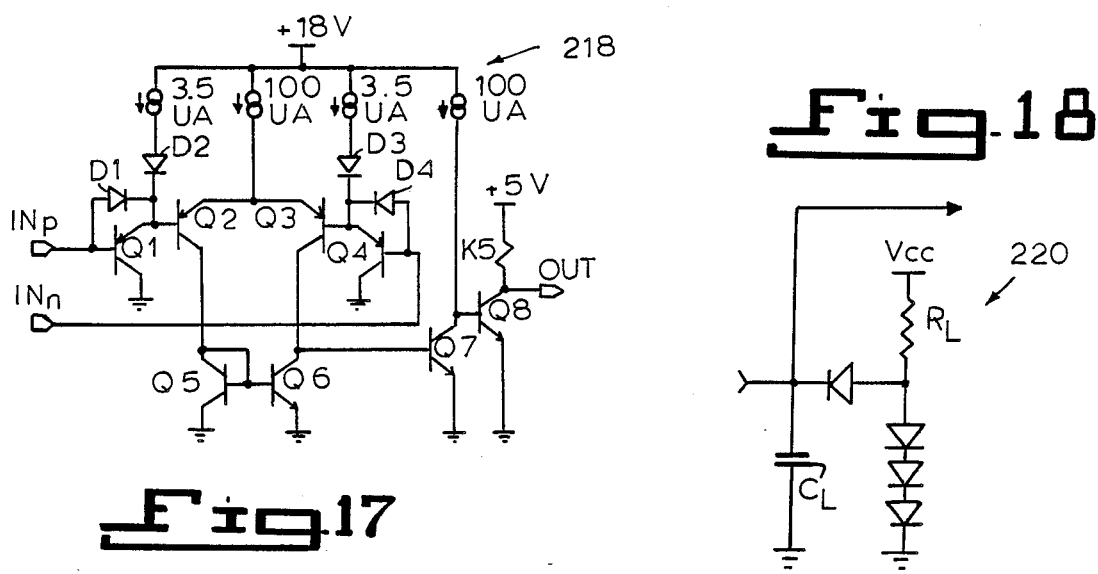
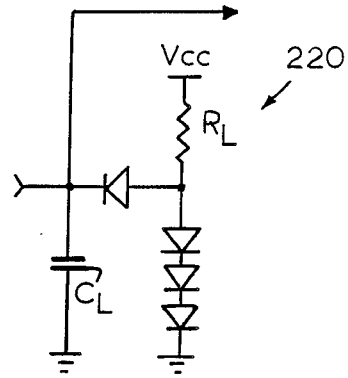
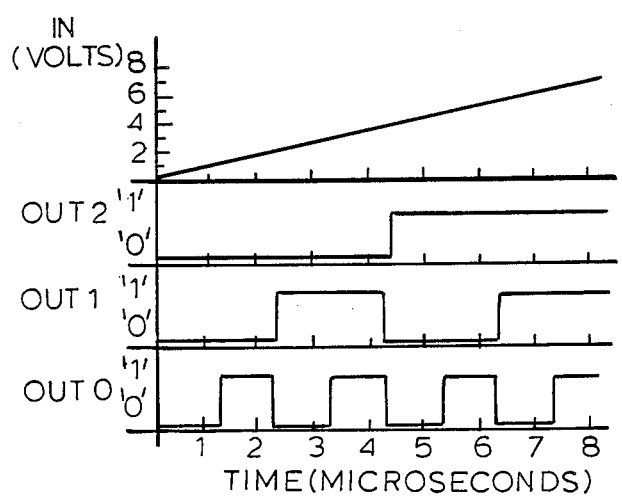

SIMULATOR FOR SYSTEMS HAVING ANALOG AND DIGITAL PORTIONS

BACKGROUND OF THE INVENTION

This invention relates to circuit simulators used in computer aided design of electronic circuits and systems. More particularly, this invention relates to simulator systems having the capability of simulating both analog and digital circuits.

There are many existing systems which provide the electrical engineer with circuit or system analysis capability. For example, the SPICE (Simulation Program with Integrated Circuit Emphasis, University of California at Berkeley) program has for many years provided analog signal analysis capability. Data concerning the circuit to be analyzed was generally provided to the computer by using conventional loop, node and component value data. Formatting such data is a slow and error prone task. Further, since a complete circuit analysis for every loop and node is provided, a large amount of time is required to run the program for circuits of some complexity.

More recently, such systems have been interfaced to high resolution graphics displays which permit schematic capture; that is, recording a circuit diagram as it is drawn and associating information about how the components of the circuit are connected and the function of the components with the finished "drawing" on the display.

There are also existing systems which model the operation of arrangements of digital circuits, thus permitting the engineer to simulate and therefore predict their operation without having to breadboard them. In addition, various methods and systems have been developed to test the operation of such circuits. An example of a digital analysis program is Mentor Graphics SIM ™ or QUICKSIM ™.

Some attempts have been made to perform analysis on circuits or systems having both analog and digital components. Such systems have generally proved to be unsatisfactory. By attempting to incorporate the best features of both analog and digital simulators, by compromising on speed and accuracy, these systems generally produce less than satisfactory results. A mixed analysis mode, which cannot be characterized as being analog or digital in nature, is used. Generally, only transient analysis of digital circuits with MOS transistors is possible. The only primitives supported are MOS transistors, resistors, capacitors and voltage sources referenced to ground. In contrast, SPICE supports sixteen primitives.

The engineering workstation (EW) has made available to the electrical engineer analog analysis programs, digital analysis programs, schematic capture routines, and high resolution graphics including multi-window displays. An example of such a system is that supplied by Mentor Graphics Corporation of Beaverton, Oregon. This workstation utilizes an Apollo Computers, Inc. Apollo ™ computer and is programmed with Mentor Graphics MSPICE ™ and QUICKSIM ™ software. However, it does not have the capability of providing complete end-to-end simulation and analysis of circuits or systems having both analog and digital portions.

BRIEF SUMMARY OF THE INVENTION

It is a principal object of the present invention to provide a system for simulating the operation of circuits or systems having analog portions and digital portions.

It is another object of the invention to provide the capability of simulating circuits in systems having analog and digital portions in an engineering workstation environment.

It is a further object of the invention to provide means for efficiently transferring data between an analog simulator and a digital simulator.

It is still another object of the invention to provide a system which overcomes the limitations of existing mixed mode simulators.

It is yet another object of the invention to provide a system for simulating the operation of circuits or systems having analog portions and digital portions which is user interactive and user friendly.

It is still another object of the invention to convert signals from analog to digital form and from digital to analog form without adding excessive overhead to the execution time of the simulators.

In accordance with the invention, an apparatus has input means for inputting data concerning a circuit having at least one analog portion and at least one digital portion. Analog analysis means provide analog analysis data of the analog portion of the circuit. Digital analysis means provide digital analysis of the digital portion of the circuit. Output means are provided for outputting selected portions of said analog and digital analysis. A first data extraction means extracts selected analog analysis data from the analog analysis means. A first conversion means converts the selected analog analysis data into digital values. A first data insertion means inserts the digital values into the digital analysis means. A second data extraction means extracts selected digital analysis data from the digital analysis means. A second conversion means converts the selected digital analysis data to analog data. A second data insertion means inserts the analog data into the analog analysis means.

BRIEF DESCRIPTION OF THE DRAWINGS

In order that the invention may be readily carried into effect, it will now be described with reference to the accompanying drawings, where:

FIG. 16 is a schematic diagram of an exemplary circuit to be simulated by the apparatus of FIG. 1;

FIG. 17 is a detailed schematic diagram of an exemplary circuit for the voltage comparators of FIG. 16;

FIG. 18 is a detailed schematic diagram of an exemplary circuit for the analog to digital interfaces of FIG. 16: and FIG. 19 is a graphical representation of various waveforms of the circuit of FIG. 16.

DETAILED DESCRIPTION OF THE PREFERRED EMBODIMENT

Figure 1:
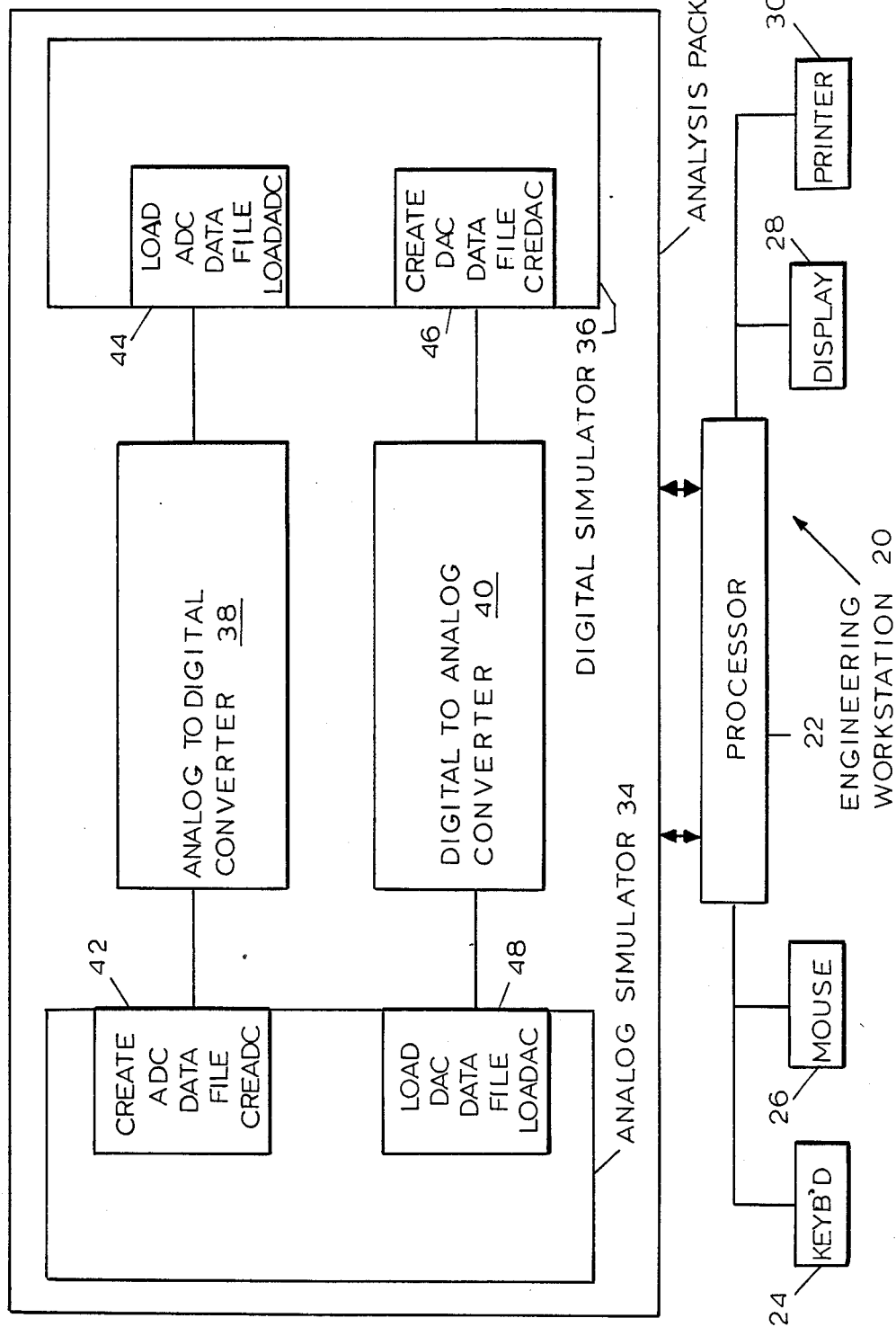
FIG. 1 is a block diagram of the apparatus according to the invention.

Referring to FIG. 1, an apparatus according to the invention is implemented by using an engineering workstation 20. Workstation 20 is preferably an Idea Station TM produced by Mentor Graphics Corporation. Workstation 20 includes a processor 22 which is an Apollo TM Domain Series computer, for example, DN660, and thus includes a central processing unit, memory, an operating system and data input and output hardware, as is well known in the art.

Input devices such as a keyboard 24 and a mouse 26 are interfaced to processor 22. Output devices such as a display 28 and a printer 30 provide instantaneous and hard copy output of analysis performed. Keyboard 24 and display 28 may be parts of a high resolution display terminal.

Processor 22 of workstation 20 has an analysis package 32 which performs circuit analysis on the circuit data inputted by using keyboard 24 and mouse 26. The analysis package 32 includes an analog simulator 34 which is preferably an interactive form of SPICE version 2G.6, which supports graphical circuit creation and postprocess charting of any circuit parameter. Analysis that can be performed includes direct current operating point and transfer function, small signal frequency response, transient, distortion, noise, sensitivity and Fourier. Component value can be changed interactively and waveforms can be traced during simulation.

Analysis package 32 also includes a digital simulator 36 which is QUICKSIM TM, a modern version of SIM TM According to the invention, analysis package 32 is supplemented by an analog to digital data conversion routine 38 called ADC and a digital to analog data conversion routine 40 called DAC. In addition, a routine 42 called CREADC, serves a data extraction function by creating an analog data base for use by ADC for conversion to digital data and a routine 44, called LOADADC, serves a data insertion function by transferring the digital data from ADC into digital simulator 36. A routine 46 called CREDAC serves a second data extraction function by creating a file of digital levels at various times which are converted to analog signals by DAC. Finally, a routine 48 called LOADAC serves a data insertion function by transferring the analog data produced by DAC to analog simulator 34.

When using engineering workstation 20, CREADC appears as a menu item or program that the user can select with appropriate manipulation of the controls of mouse 26. CREADC is a macroprogram, that is a generalized command that cause a series of other commands to be executed, which gathers the required data generated by analog simulator 34 which is to be provided to digital simulator 36.

The user then executes ADC which is an operating system interface program. The data obtained by CREADC is converted to digital forcing functions which are required input to digital simulator 36. The forcing functions are an array of digital logic levels (zeros or ones) associated with times at which these levels obtain.

LOADADC is also a menu item which the user selects. It serves to gather the data from ADC and provides it to digital simulator 36.

After the digital simulation has been run, CREDAC, also a menu item, gathers digital data for use by DAC, an operating system program. DAC converts the digital data supplied by CREDAC to arrays including voltage as a function of time. LOADAC, also a menu selected item, then provides the data generated by DAC to analog simulator 34.

The macroprograms CREADC, LOADADC CREDAC and LOADAC are advantageously written in Mentor Graphics Human Interface Language (HI) which is a structured higher level language.

To make the system more user friendly, it is preferable that if the user simply hits return, the program will generate a default name; that is, a name generated by the program will be assigned for the relevant file.

Figure 2:
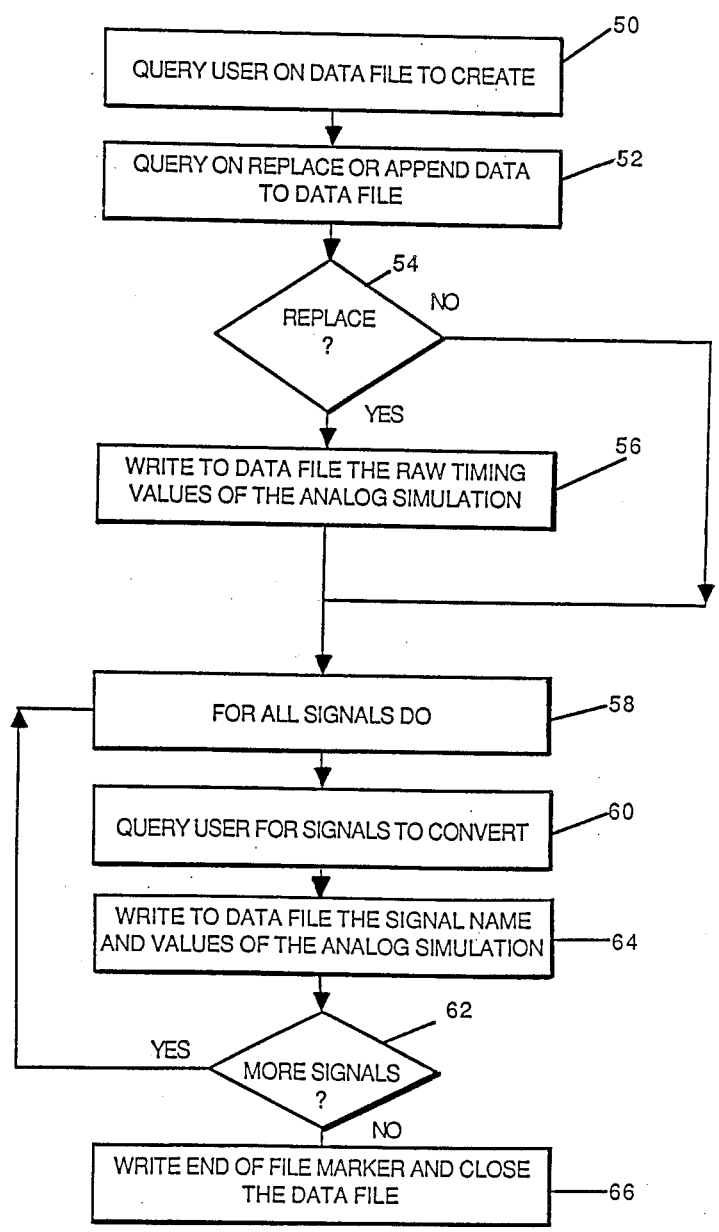
FIG. 2 is a flow chart of the routine CREADC of FIG. 1.

Referiing to FIG. 2, CREADC, at step 50, provides a query to the user as to the name of the data file the user wishes to create. At step 52, a query as to whether the data in the file is to be replaced or as to whether data is to be appended is presented. This step provides an opportunity to gather more signal information into the existing data file. If the user answers Append (NO) to the inquiry, additional data will be appended rather than "written over" existing data.

If the user answers Replace (YES) at step 54 then the raw timing values utilized by analog simulator 34 are written into the data file at step 56. Raw sample time points, which are determined by SPICE based on the rate of change of the signals, are utilized in lieu of uniform sampled time points in order to improve conversion accuracy. Raw sample time points have greater resolution during transitions, where conversion will be performed, than uniform sampled time points.

Step 58 begins a loop which at step 60 provides a query as to which signals, by name, are to have values at times corresponding to those established at step 56, entered into a data array. At step 62, the user answers an inquiry as to whether more signals are to be converted. If the name of the last signal to be converted has been entered at step 60, the user enters NO at step 62. At step 64, the signal name and value are written into arrays in the data file. At step 66, an end of file marker is written in and the data file is closed.

Figure 3:
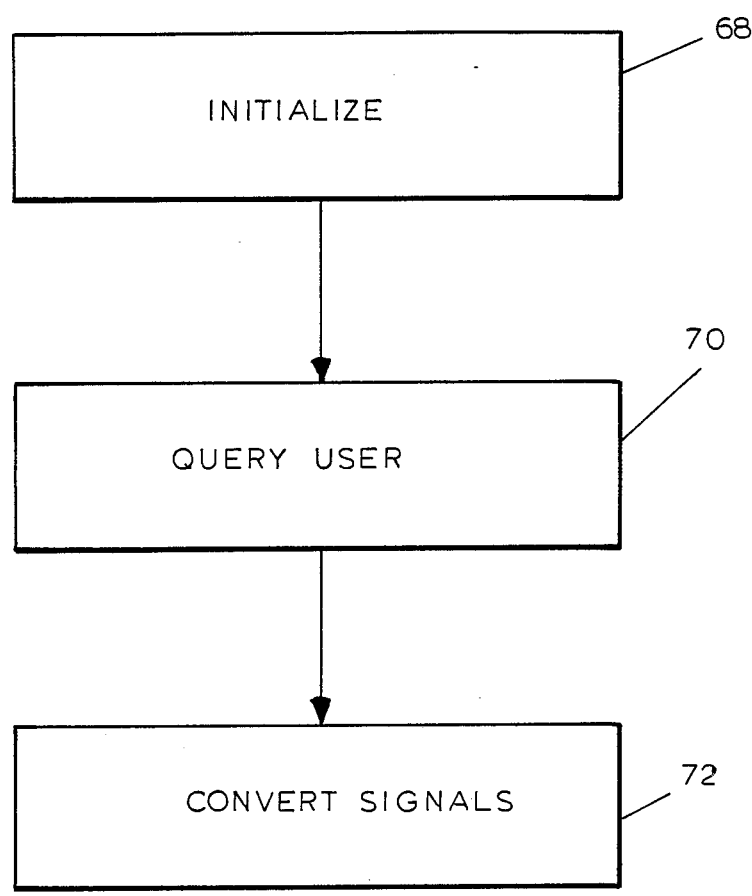
FIG. 3 is a flow chart of the routine ADC of FIG. 1.
Figure 4:
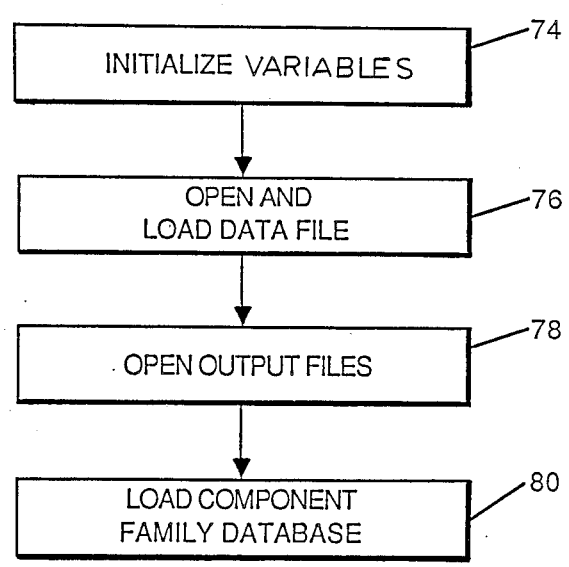
FIG. 4 is a flow chart of the subroutine INITIALIZE of FIG. 3.

Referring to FIG. 3, ADC, at step 68, performs required initializations by calling INITIALIZE (FIG. 4). At step 70, QUERY USER (FIG. 5) is called and the user is queried as to what information is required by ADC to perform the conversion of data. At step 72, the actual conversion takss place.

Referring to FIG. 4, INITIALIZE, at step 74, initializes variables. At step 76, required data files are opened and loaded. At step 78, required output files are opened.

A component family data base, which includes relevant nominal, minimum and maximum input threshold voltage levels for various families of digital devices, such as, for example, Schottky, low power Schottky, etc., is then loaded into active memory at step 80. There are six values in the data base for each technology. There are the nominal, minimum and maximum for transitions from 0 to 1, and nominal, minimum and maximum for transitions from 1 to 0. The values in this data base, which in effect specify what input voltage defines the threshold between a logic zero and a logic one, may be obtained from manufacturers' data sheets. It should be noted that these values are the actual input voltage at which the state of the digital devices changes; it does not include noise margin (immunity). This is to prevent an unknown logic state from being generated as input to the digital simulation, which could cause the simulation to halt. An exemplary table is Table 1 set forth below.

that is, the relevant time frame, there is a change in state of the signal. If there is no state change, the program branches to step 105, where the program determines whether there are any more time steps. If the last time step has been evaluated, then a determination is made at step 106 if more signals are to be evaluated. If the last signal has been evaluated, the program branches to step 108 and terminates.

If there is a state change during the relevant time frame, the program branches to step 110, where each transition is determined as being a logic zero to one transition or a logic one to zero transition; that is, is the analog signal increasing or decreasing with time. This determination is made by evaluating successive values of the signal as a function of time to determine whether the voltage is rising or falling. If the voltage is rising, a zero to one transition is indicated. The program then branches to step 112, where the logic level is deter-

TABLE 1

| Device Family | | 0-1 Transition | | | 1-0 Transition | | |
|---|---|---|---|---|---|---|---|
| | | MIN | NOM | MAX | MIN | NOM | MAX |
| ALS | | 0.9 | 1.1 | 1.25 | 0.9 | 1.1 | 1.25 |
| AS | | 1.15 | 1.4 | 1.6 | 1.15 | 1.4 | 1.6 |
| F | | 1.3 | 1.6 | 1.75 | 1.3 | 1.6 | 1.75 |
| LS | | 0.9 | 1.1 | 1.19 | 0.9 | 1.1 | 1.19 |
| LS | -Schmitt | 1.5 | 1.75 | 2.0 | 0.6 | 0.85 | 1.1 |
| S | | 1.19 | 1.3 | 1.42 | 1.19 | 1.3 | 1.42 |
| S | -Schmitt | 1.6 | 1.77 | 1.9 | 1.1 | 1.22 | 1.4 |
| STD | | 1.1 | 1.35 | 1.55 | 1.1 | 1.35 | 1.55 |
| STD | -Schmitt | 1.5 | 1.7 | 2.0 | 0.6 | 0.9 | 1.1 |
| MIL ALS | | 0.9 | 1.1 | 1.25 | 0.9 | 1.1 | 1.25 |
| MIL AS | | 1.15 | 1.4 | 1.6 | 1.15 | 1.4 | 1.6 |
| MIL F | | 1.3 | 1.6 | 1.75 | 1.3 | 1.6 | 1.75 |
| MIL LS | | 0.9 | 1.1 | 1.19 | 0.9 | 1.1 | 1.19 |
| MIL STD | -Schmitt | 1.5 | 1.75 | 2.0 | 0.6 | 0.85 | 1.1 |
| MIL S | | 1.19 | 1.3 | 1.42 | 1.19 | 1.3 | 1.42 |
| MIL S | -Schmitt | 1.6 | 1.77 | 1.9 | 1.1 | 1.22 | 1.4 |
| MIL STD | | 1.1 | 1.35 | 1.55 | 1.1 | 1.35 | 1.55 |
| MIL STD | -Schmitt | 1.5 | 1.7 | 2.0 | 0.6 | 0.9 | 1.1 |
| CMOS | VDD = 5V | 2.25 | 2.5 | 2.75 | 2.25 | 2.5 | 2.75 |
| HCT | VDD = 5V | 2.25 | 2.5 | 2.75 | 2.25 | 2.5 | 2.75 |
| HC | VDD = 5V | 2.25 | 2.5 | 2.75 | 2.25 | 2.5 | 2.75 |
| ECL10K | | −1.35 | −1.29 | −1.24 | −1.35 | −1.29 | −1.24 |
| PLD* | | 0.0 | 0.0 | 0.0 | 0.0 | 0.0 | 0.0 |

*Programmable Logic Device - values specified by user

Figure 5:
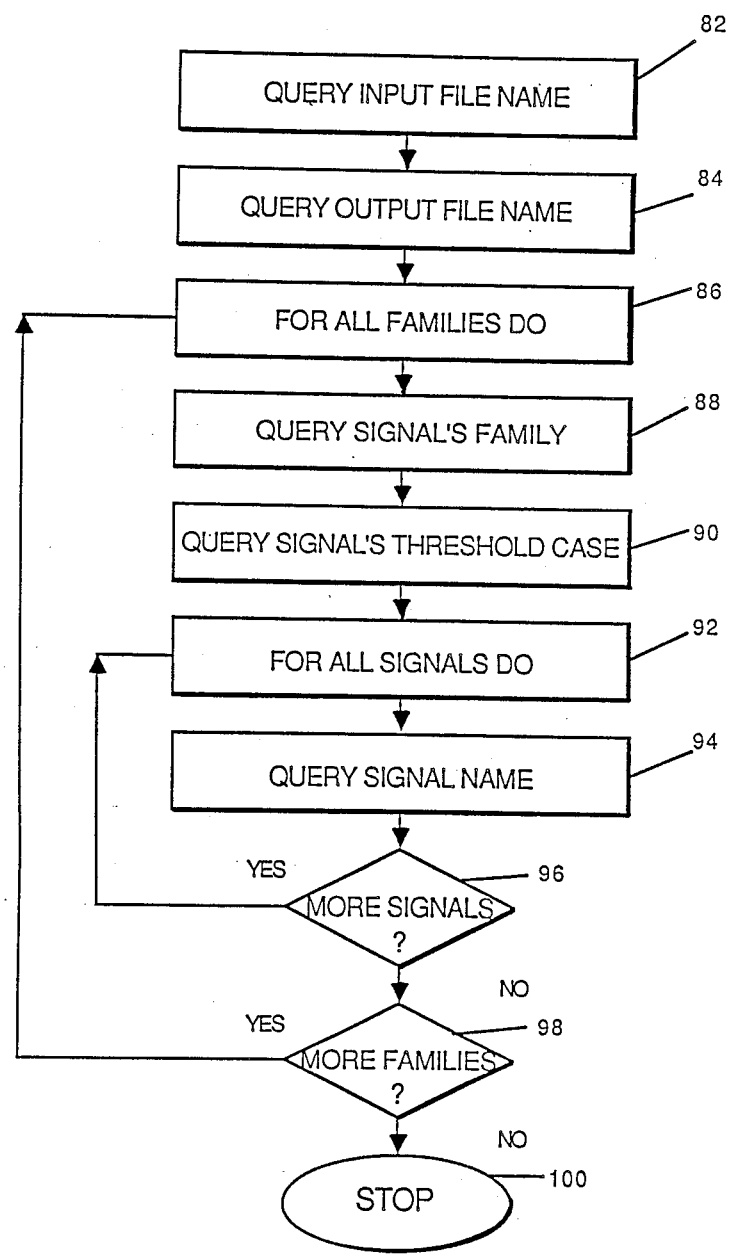
FIG. 5 is a flow chart of the subroutine QUERY USER of FIG. 3.

Referring to FIG. 5, subroutine QUERY USER at step 82, asks the user to provide a name for the input file for ADC. At step 84, the user is asked to provide a name for the output file. These files are opened. Normally, the user will type the name and hit return on keyboard 24.

At step 86, a loop is entered which provides a query at step 88 of what family of devices (that is, what technology) each signal is going to. At step 90, the user is queried as to what threshold case for the family specified at step 88 should be used, that is, nominal, minimum or maximum for the logic transitions. At step 92, another loop is entered which at step 94 provides a query as to every signal that falls under the family specified at step 88 nnd the threshold case specified at step 90. A possible response is all signals. However, any mix of technologies (that is, families) and thresholds can be accommodated. At step 96, the user answers an inquiry as to whether there are more signals, while at step 98, the user answers an inquiry as to whether there are more families. When the user response at step 98 is NO, QUERY USER terminates at step 100.

Figure 6:
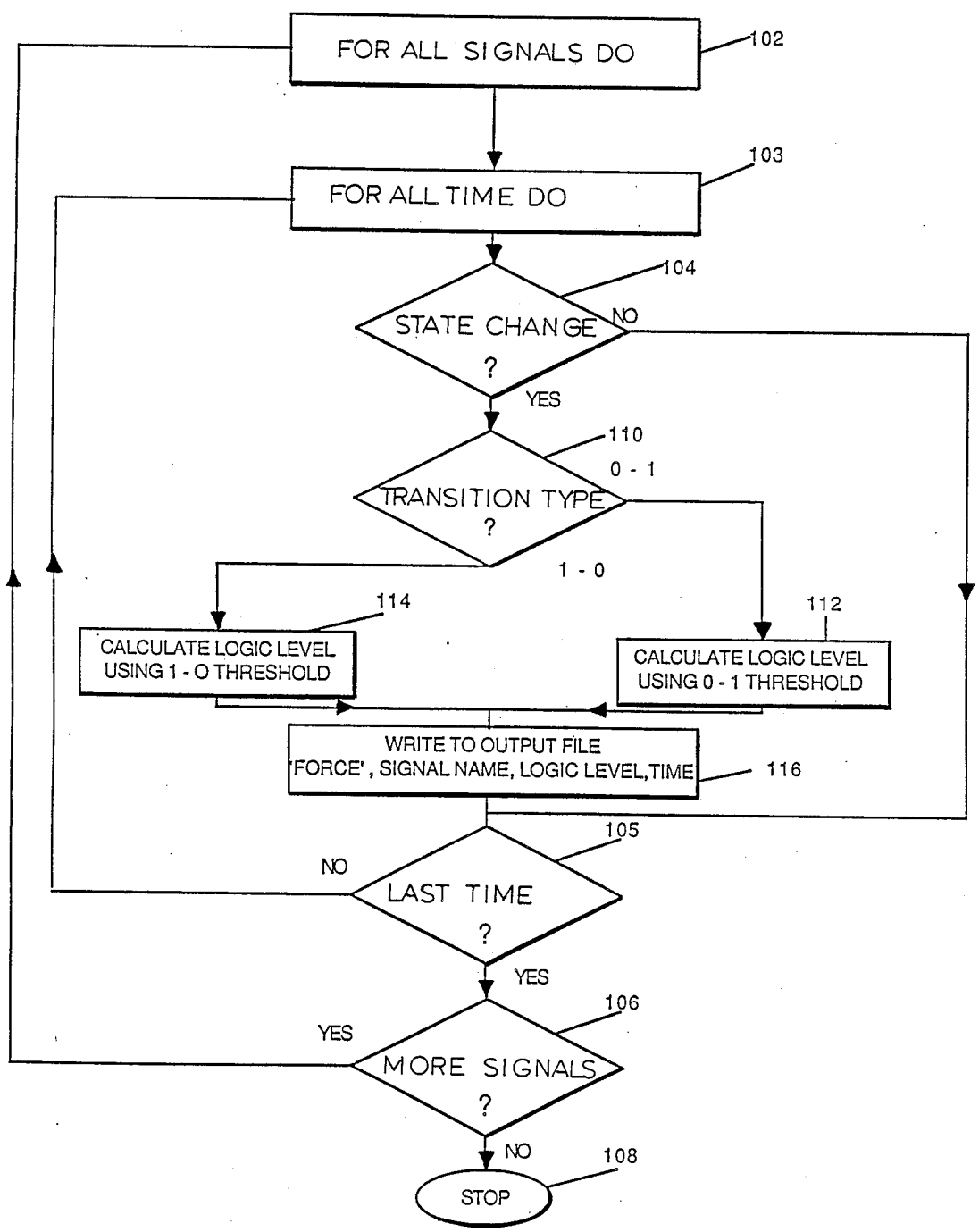
FIG. 6 is a flow chart of the subroutine CONVERT SIGNALS of FIG. 3.

Referring to FIG. 6, in subroutine CONVERT SIGNALS, at steps 102 and 103, loops are entered wherein the actual conversions of the signals is performed. At step 104, a determination is made as to whether, during the entire time frame, specified during step 56 (FIG. 2), mined using the zero to one transition threshold selected at step 90 (FIG. 5) from the component data base loaded at step 80 (FIG. 4).

If, at step 110, it is determined that a logic one to logic zero transition occurs during the relevant time frame, then the program branches to step 114, where a determination of the logic level is made using the one to zero transition threshold selected at step 90 (FIG. 5) from the component data base loaded at step 80 (FIG. 4).

At steps 112 and 114, the analog waveforms are converted into digital input forcing functions by scanning through the voltage arrays until a threshold is reached, and then defining the change in state of the signal at that time in a forcing statement. An analog voltage greater than the high threshold will be a logic one and less than the low threshold will be a logic zero.

From step 112 and step 114 the program continues to step 116 where the word "FORCE", the signal name, logic levels and times are stored in an output file. This file, containing only data needed to define all the transitions, provides the digital forcing functions needed by LOADADC.

Figure 7:
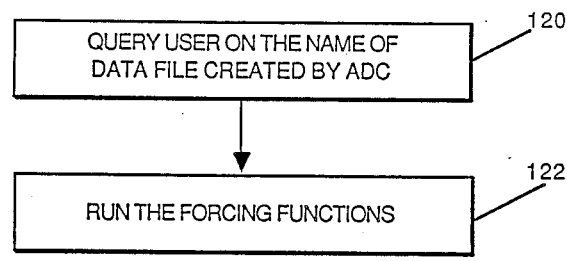
FIG. 7 is a flow chart of the routine LOADADC of FIG. 1.

Referring to FIG. 7, which represetts LOADADC, control is then transferred to digital simulator 36 which at step 120, provides a query to the user as to which data file to load. If the user hits return, the default file is exactly the one created by ADC. If another name was used, it is called at this time. At step 122, the forcing functions are run, as input to the digital simulator.

When LOADAC has run, digital simulator 36 then models the digital portion of the circuit being simulated. The results of the digital simulation can be transferred back to analog simulator 34.

Figure 8:
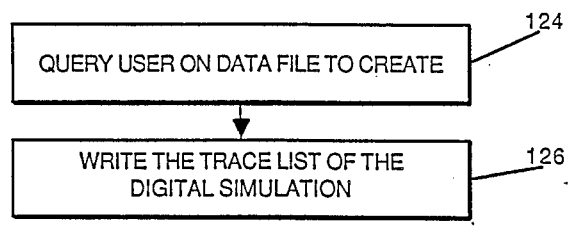
FIG. 8 is a flow chart of the routine CREDAC of FIG. 1.

Referring to FIG. 8, CREDAC, at step 124, provides a query to the user to define the name of the data file to be created for transferring data from CREDAC to DAC. If the user does not specify a name, the default name is used. At step 126, the program writes a trace list of the digital simulation; that is, a truth table as a function of time of digital outputs of the digital portion of the circuit being simulated is created.

Figure 9:
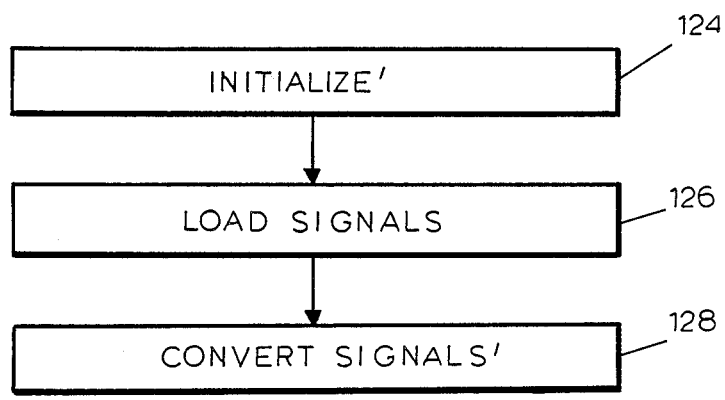
FIG. 9 is a flow chart of the routine DAC of FIG. 1.

Referring to FIG. 9, the routine DAC, at step 124, executes the routines INITIALIZE'. At step 126, the signals from CREDAC are loaded into an array. The conversion from digital to analog signals takes place at step 128.

Figure 10:
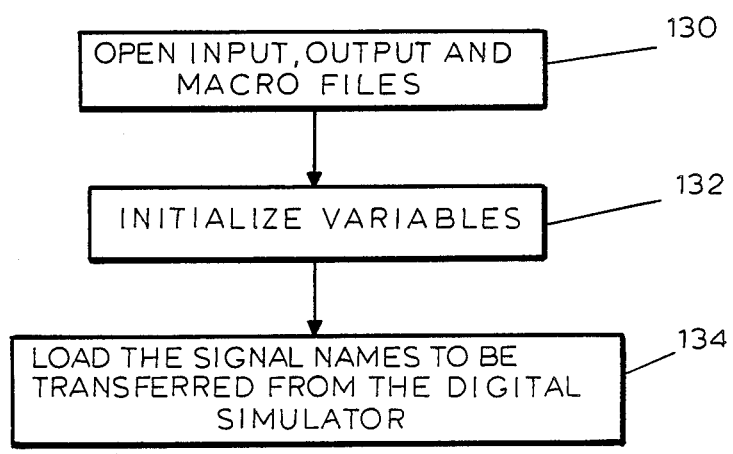
FIG. 10 is a flow chart of the subroutine INITIALIZE' of FIG. 9.

Referring to FIG. 10, the subroutine INITIALIZE' opens an input file, an output file and a macrofile, at step 130. Thus, DAC, by creating a macrofile, is effectively creating another program that will be run.

At step 132, variables are initialized. At step 134, the signal names that are loaded in the data files are placed in an array. At this point, only the signal names, but not the actual data, are loaded. This increases the speed of operation of the program.

Figure 11:
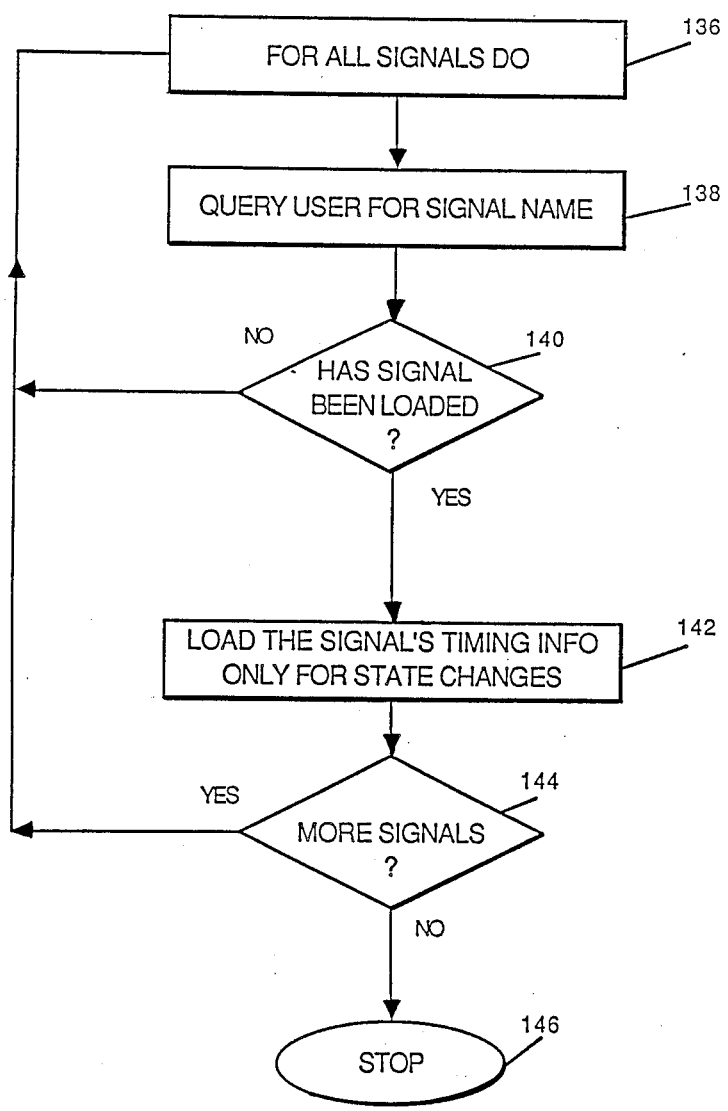
FIG. 11 is a flow chart of the subroutine LOADSIGNALS of FIG. 9.

Referring to FIG. 11, the subroutine LOADSIGNALS begins, at step 136, a loop which at step 138 provides a query for the name of a signal to be converted. At step 140, a check is conducted to determine whether the signal name provided at step 138 is in the data file created at step 134 (FIG. 10). If it is not, a message is provided to the user advising of this, and the program loops back to step 136, giving the user a chance to correct the name. If the name is found in the file, at step 142, the timing information for the changes in state of that signal are loaded into the file. It should be noted that only the times when the signal actually changes state are loaded, that is, data compaction takes place at this point, during the actual loading of data, to improve conversion efficiently. When all the signals have been loaded, the program branches from step 144 to step 146 where LOADSIGNALS is terminated.

Figure 12:
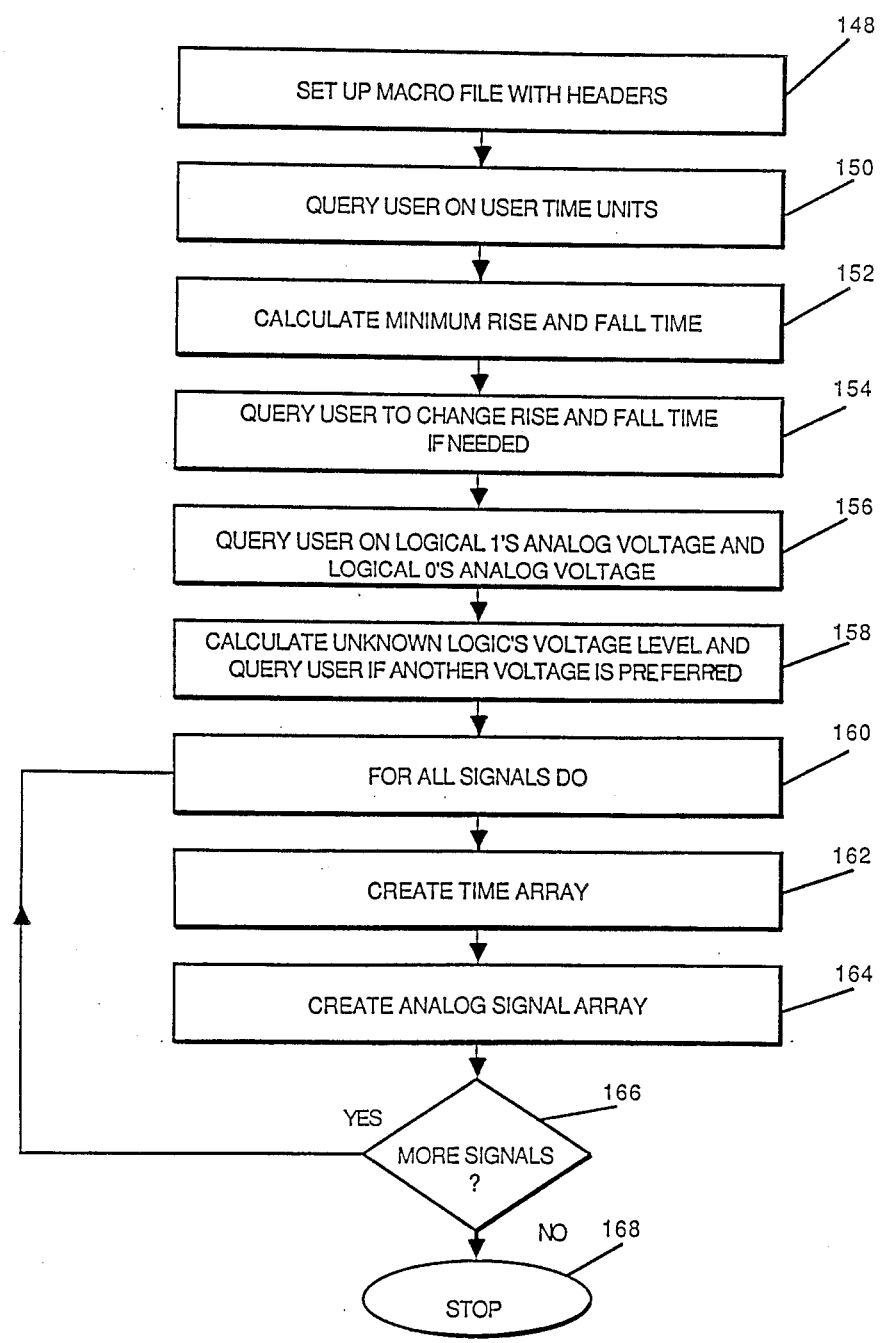
FIG. 12 is a flow chart of the subroutine CONVERT SIGNALS' of FIG. 9.

Referring to FIG. 12, the subroutine CONVERT SIGNALS' (FIG. 9), at step 148, first sets up a macrofile containing a query for the name of the file which will contain the converted analog input waveform data, discussed at steps 160 through 166. This macrofile will also contain individual waveform definition statements for each signal, as discussed in step 188. Input waveforms will be piecewise linear in form. That is, an array of voltage and time points will be generated and a continuous waveform will be provided by interpolating between these points.

At step 150, the user is asked to input the time units (milliseconds, microsecond, etc.) being used for the hybrid simulation, that is, the total circuit or system simulation, iccluding the analog simulation and the digital simulation. At step 152, minimum rise and fall times for the signals are calculated. Because Mentor Graphics MSPICE rounds these data values to four significant figures, the program finds the largest time value and calculates the minimum rise/fall time from it (that is, if maximum time is between 1000 and 9999, the minimum rise/fall time is 1, or approximately 1/10,000 of 9999). The calculated rise and fall time is displayed, and the user is given an opportunity to increase the rise and fall times, at step 154, if this more accurately reflects the actual circuit response. Too short a rise time would result in time data values that are not strictly monotonically increasing, causing the simulation to fail. If prompting is not desired, the program may use predetermined default values.

At step 156, the user is asked to specify the voltage that the digital circuit produces for a logical one and a logical zero. At step 158, the voltage of any unknown logic states produced by the digital circuit is calculated and displayed, and the user queried as to whether another voltageiis preferred. Generally, unknown voltages will be set at a value equal to the average of the logic one voltage of the digital portion of the system and the logic zero voltage.

Figure 13:
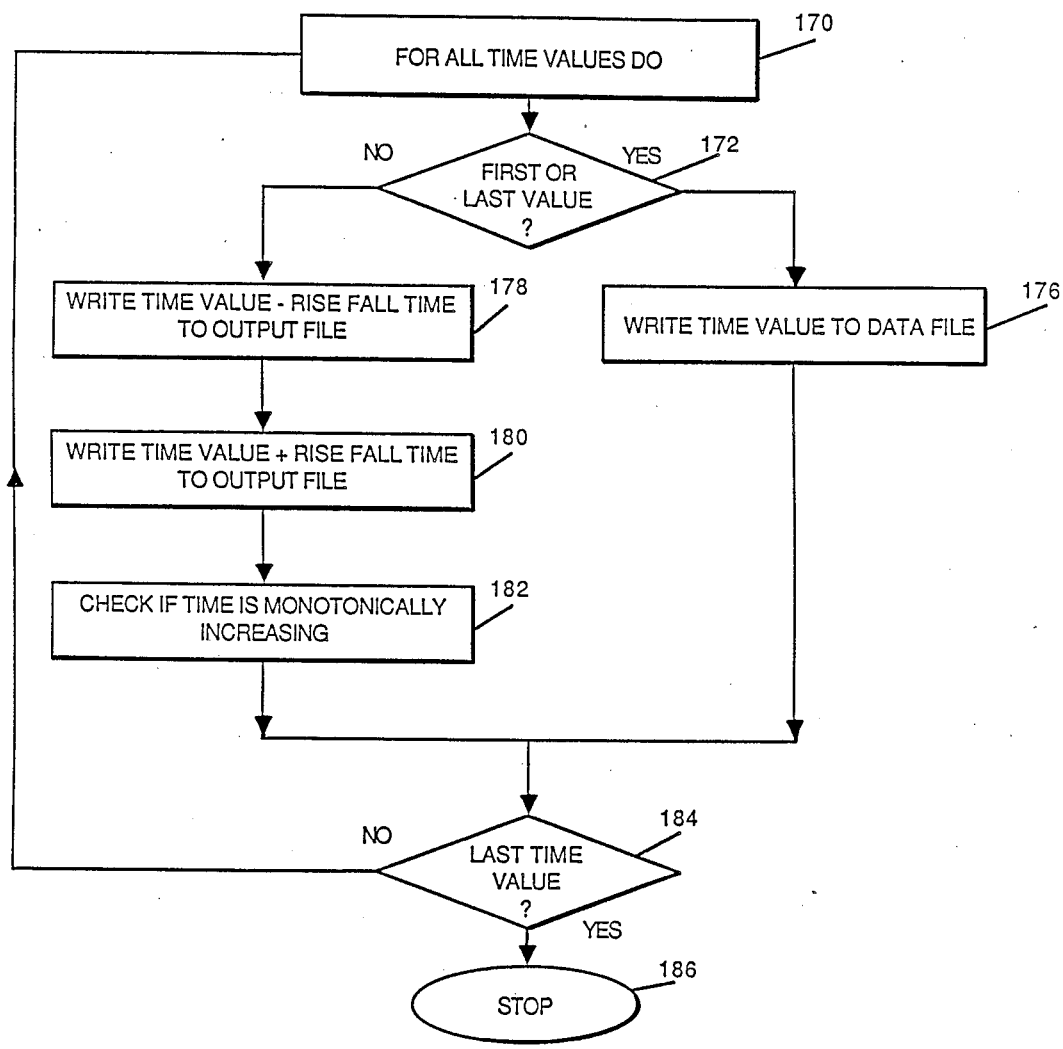
FIG. 13 is a flow chart of the subroutine CREATE TIME ARRAY of FIG. 12.
Figure 14:
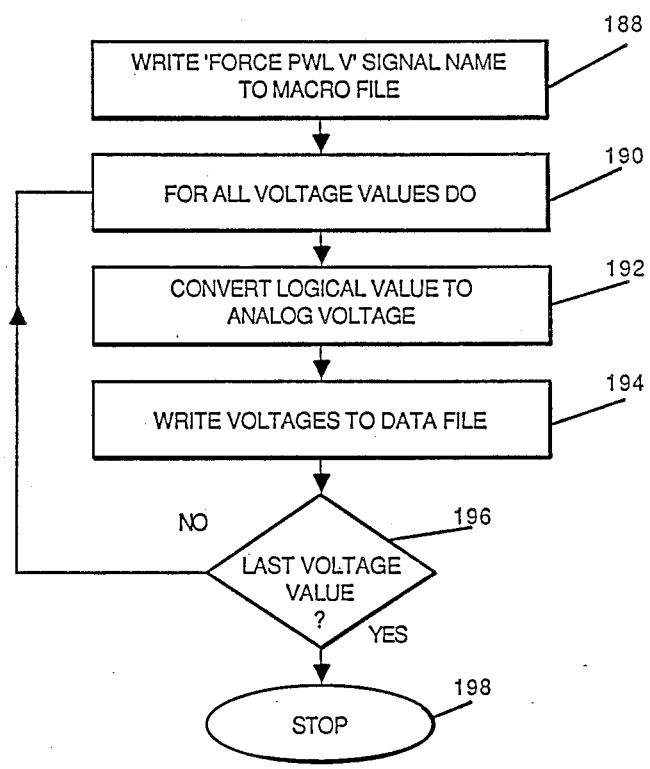
FIG. 14 is a flow chart of the subroutine CREATE ANALOG SIGNAL ARRAY of FIG. 12.

A loop is entered at step 160 which, at step 162, creates a time array by executing CREATE TIME ARRAY (FIG. 13) and at step 164 creates an analog signal array for each signal by executing CREATE ANALOG SIGNAL ARRAY (FIG. 14). At step 166, if there are no more signals, the program branches to step 168, and CONVERT SIGNALS' is terminated.

Referring to FIG. 13, the subroutine CREATE TIME ARRAY at step 170, enters a loop whichiis executed for all values of the signal specified in the loop of FIG. 12. In other words, the loop starting at step 170 is nested in the loop starting at step 160. At step 172, a determination is made as to whether the current value is the first or last value for the signal. If it is, the program branches to step 176, where the time corresponding to that value is written into the data file. If it is not the first or last value, the program branches to step 178, where the time minus the rise or fall time is written in the output file. This provides the increment in analysis time just before the time of occurrence of the value. At step 180, the time plus the rise or fall time is written in the output file. This provides the increment in analysis time just after the time of occurrence of the value. At step 182, a check is made to see if time is monotonically increasing; that is the present value of time is strictly greater than the previous value of time within the resolution of the significant figure limit. This assures that at a digital transition there are not two voltages associated with the same time value. If it is not, the user receives an error message indicating a need for an adjustment in the rise and fall times specffied at step 154. When the last value is reached, the program, at step 184, branches to step 186 and CREATE TIME ARRAY is terminated.

Upon termination of CREATE TIME ARRAY, CONVERT SIGNALS (FIG. 12) continues on to CREATE ANALOG SIGNAL ARRAY, illustrated in FIG. 14. At step 188, the program writes in the macrofile the command "FORCE PWL V" (force piecewise linear voltage), and the signal name (which at this point is known). At step 190, the program goes to the data file and enters a loop which writes the voltage array. At step 192, the logical values are converted to the known analog voltages for these levels. The analog voltage for the unknown state is also known, as this value has been calculated and the user has been queried as to whether the calculated value is correct at step 158 (FIG. 12). Thus, these conversions are look up tasks. At step 194, the results of the conversion are written into the data file. When the last voltage value (corresponding to all the relevant times) has been converted, as determined at step 196, CREATE ANALOG SIGNAL ARRAY terminates at step 198, returning to step 166 of CONVERT SIGNALS (FIG. 12). When all signals have been dealt with, CONVERT SIGNALS terminates.

Figure 15:
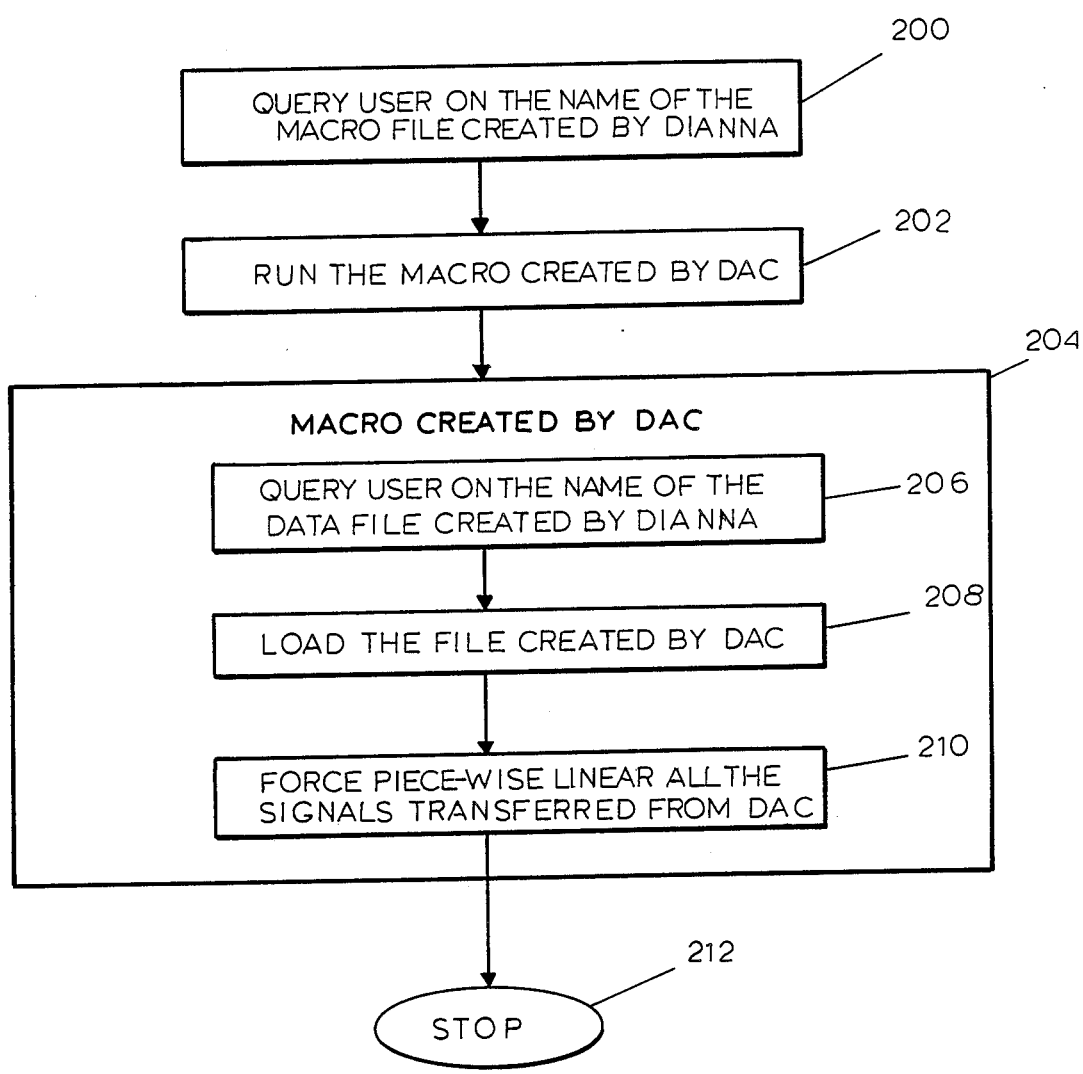
FIG. 15 is a flow chart of the routine LOADAC of FIG. 1, including a marco program created by the routine DAC of FIG. 1.

The last macroprogram that is run is LOADAC created by DAC. This brings the macrofile created by DAC into analog simulator 34. The macrofile will in turn bring the data file into analog simulator 34. Referring to FIG. 15, at step 200, the user is queried on the name of the macrofile created by DAC. When the user types in the name, at step 202, the macro 204 created by DAC is run.

Macro 204, at step 206, queries the user for the name of the data file created by DAC. At step 208, that data file is loaded. At step 210, piecewise linear waveforms are generated for all the signals transferred from DAC. At step 212, the programs according to the invention terminate and analog simulator 34 again begins operation with the signals produced by DAC as simulation inputs.

While the general description set forth above encompasses a single transfer of data from the analog simulator 34 to the digital simulator 36 and a single transfer of data from the digital simulator 36 to the analog simulator 34, multiple transfers of data may be accomplished to simulate circuits having more than one analog portion and/or more than one digital portion. To accomplish such additional transfers, the procedures used above are repeated for each transfer.

EXAMPLE

Referring to FIG. 16, a three-bit flash A/D converter 214 is used as simple illustrative example. The analog portion of this circuit consists of seven voltage comparators 216. The triangular COMP symbols correspond to the circuit 218 shown in FIG. 17. This hierarchical schematic creation allows for easily visualizable designs at the top level with detailed circuit description at a lower level. The comparators 216 have a reference voltage of from one to seven volts on their inverting inputs. This reference voltage is derived from the resistor ladder R1-R8 and voltage source V1. An input voltage IN is applied to all non-inverting inputs of the comparators. The output of the comparator will be five volts if the input exceeds the reference, and 0.1 volt, if not.

The interface between the analog and digital circuitry is denoted by the special port symbols A-D which are modelled as shown by circuit 220 in FIG. 18. Such symbols serve two purposes. They provide a clear demarcation between what is simulated by the digital simulator and what is simulated by the analog simulator. They also provide the means to model transparently (one level down in the hierarchy) the loading and source impedance effects between stages. In order to assure accurate results in the overall simulation, it is necessary to include the loading and source effects of the digital circuitry within the analog simulation, where they can be more precisely modelled. FIG. 18 shows the model of the input loading of a TTL device. $R_L$ depends on the particular TTL family and $C_L$ depends on the interconnection distance between the analog and digital portions of the circuit. It is necessary to include a similar circuit at the digital to analog interface. Here, the source resistance of the digital output must be included with the piecewise linear waveform generator in the analog simulation, to obtain accurate results.

With the use of a look-up table similar to Table 1, digital source and loading effects can be automatically extracted from the circuit data base and included in the analog simulation.

The digital portion of circuit 214 is an 8 to 3 encoder. The end-to-end hybrid simulation results are shown in FIG. 19. A linear sweep in voltage from 0 to 8 volts is applied to the input. The output waveforms of the comparators are extracted from a SPICE transient analysis. They are converted to digital forcing functions and passed as input to a logic simulation of the encoder which produces the binary output sequence shown.

From this simple example, one can extend the application of the hybrid simulator to complex avionic systems such as digital flight control systems. From sensors through A/D conversion, digital signal processing, D/A conversion to hydraulic actuators, the system may be modelled and simulated using this tool.

In the system described above, the user must manually invoke each of the simulators, and the data extraction, conversion, and forcing modules. This procedure permits full control and visibility of all the intermediate data during a hybrid simulation. In order to provide the capability of running this simulator in a hands-off mode, an executive control program which permits the user to predefine all conversion levels, simulation sequences, and external forcing functions may be used. With the issuing of a single command, all of the necessary simulations and conversions take place automatically and results are saved for later viewing.

While hhe system of the present invention has been described with respect to sequential simulation, a concurrent hybrid simulator which permits analysis of closed-loop circuits having analog and digital portions can be implemented. This concurrent simulator is similar to the sequential simulator in its data extraction, conversion, and forcing procedures. However, instead of running each simulation to conclusion before passing the results on to the next stage, information is exchanged in small increments of time between the analog and logic simulators, which run simultaneously.

In the concurrent system, the initial state of the entire circuit is determined by applying all external forcing functions/waveforms and assuming an initial state/voltage for any feedback paths between analog and digital stages. Then, both simulators are run from 0 to $\Delta t$ sec, and the feedback assumptions are verified. If they were incorrect, the initial state/voltage of feedback paths are updated and the simulators are again run from 0 to $\Delta t$. This continues until all feedback conditions are stable or an iteration limit is reached. Once this steady state at $\Delta t$ is reached, all of the interface signals between the two simulations are updated to the $\Delta t$ value and the simulations continue to $2\Delta t$. This procedure continues until the end time is reached. The $\Delta t$ time steps must be chosen so as to be small enough to give accurate results on rapidly changing signals, but not so small as to result in excessive run times. Since SPICE determines its time steps based on the rate of change of signals, the logic simulator may be synchronized to the SPICE time steps.

In a concurrent system, different simulations are effectively carried on "simultaneously," as far as the user is concerned, in different windows of the workstation display.

Computer-aided transistor model generation may be integrated into the present invention. Simulations are only as accurate as the models used for circuit components. Generating an accurate model is a laborious task, especially for active analog devices. A bipolar transistor, for example, can be defined by as many as forty parameters for SPICE simulation using a modified Gummel-Poon model. Using a two level approach, even an inexperienced engineer can develop a semiconductor model quickly and easily. An initial model is generated by prompting the user for information from the semiconductor data sheet or process characterization. The amount of information required. depends on the type of analysis to be performed; for example, dc analysis requires less stringent models than transient analysis. A program then convert this information into SPICE parameters and constructs a model file. If a more accurate model is required, or if there is sufficient information on the data sheets, empirical model can be developed with the use of parametric (V-I,C-V) measurement equipment linked to the engineering workstations (EWs). The EWs can automatical generate the test procedures and perform the parameter extraction necessary to develop an accurate SPICE model.

The conversion processes for converting analog signal data to input used by the digital simulator and digital signal data to input used by the analog simulators add very little overhead to the total execution time of the simulations. For example, the conversion of eight signals takes approximately two minutes, whereas the simulation of 50 transistor or 1000 gate circuits may take up to one hour. The overhead is minimized by converting only those signals required by the next used simulator, and in the case of digital signals producing a table of digital values and associated times having entries therein only when a logic transition occurs.

It will be recognized that while the present invention permits the efficient conversion of data and the exchange of data between the analog and digital simulators, the input devices of system 20 permit the entry of additional input signals to any of the analog or the digital prrtions of the circuit or system being simulated.

Although shown and described in what is believed to be the most practical and preferred embodiment, it is apparent that departures from the specific method and designs described and shown will suggest themselves to those skilled in the art and may be made without departing from the spirit and scope of the invention. We, therefore, do not wish to restrict ourselves to the particular construction described and illustrated, but desire to avail ourselves of all modifications that may fall within the scope of the appended claims.

We claim:

1. In an apparatus for simulating both analog and digital circuits, said apparatus having digital computer input means for inputting data concerning a circuit having at least one analog portion and at least one digital portion, said input means controlling said apparatus, analog analysis means for providing analog data of the analog portion of the circuit, digital analysis means for providing digital analysis data of the digital portion of the circuit, and output means for outputting at least one of said analog and digital analysis data, the improvement comprising:

a first data extraction means for extracting selected analog analysis data from said analog analysis means;

a first conversion means connected to said first data extraction means for converting the selecting analog anaylsis data into digital values,;

a first data insertion means connected to said first conversion means for inserting said digital values into said digital analysis means;

a second data extraction means for extracting selected digital anaylsis data from said digital analysis means;

a second conversion means connected to said second data extraction means for converting said selected digital analysis data to analog data; and a second data insertion means connected to said second conversion means for inserting the selected analog data into said analog analysis means.

2. The apparatus of claim 1, wherein said first data extraction means comprises:

a first data storage means; and means for placing said selected analog data in said first storage means, in an array of analog values as a function of time, each analog value being associated with the time of its occurrence.

3. The apparatus of claim 1, wherein said first conversion means comprises:

transition direction determining means for determining the direction of a change in successive values of said selected analog data as a function of time; and logic level comparison means for comparing said successive values to predetermined threshold values for logic transitions in a first direction or in a second direction, as determined by said transition direction determining means, to define digital logic values.

4. The apparatus of claim 3, further comprising:

a second data storage means; and means for placing said digital logic values in said second data storage means in an array of digital logic values as a function of time, each digital logic value being associated with the time of transition in logic value.

5. The apparatus of claim 1, wherein said first conversion means includes a table defining what digital level to define for an analog voltage provided as said selected analog analysis data.

6. The apparatus of claim 5, wherein said table includes entries defined in accordance with characteristics of at least one family of digital devices.

7. The apparatus of claim 1, wherein said analog analysis means comprises rise and fall time defining means for defining the rise and fall times of the analog waveforms.

8. The apparatus of claim 7, wherein said second conversion meansccomprises user operative modifying means for permitting a user to change the defined rise and fall times.

9. The apparatus of claim 7, further comprising means for determining whether time values associated with said analog data are monotonically increasing with time.

10. The apparatus of claim 9, wherein time is defined as being monotonically increasing when the differences between each two successive values of time are larger than one half the rise or fall time.

11. The apparatus of claim 1, wherein said second conversion means includes means for generating said analog signals so that said analog signals are piecewise linear.

12. The apparatus of claim 1, wherein said analog analysis means comprises a time base generator for defining increments of time, and means for synchronizing said analog analysis means and said digital analysis means to perform analysis in accordance with the defined increments of time.

13. The apparatus of claim 1, wherein said analog analysis means includes means for providing at least transient analog analysis.

14. The apparatus of claim 1, wherein said first conversion means includes load modelling means for modelling the loading effect of inputs to the digital portion of the circuit on the analog analysis data.

15. The apparatus of claim 1, wherein said second conversion means includes source modelling means for modelling digital output impedance effect of devices modelled in said second conversion means to produce said digital analysis data.

16. A method of simulating both analog and digital ciruits, said method comprising the steps of
inputting data concerning a circuit having at least one analog portion and at least one digital portion, said inputting being via digital computer means controlling said steps;
providing analog analysis data of the analog portion of the cicuit;
providing digital analysis data of the digital portion of the circuit;
outputting at least one of said analog and digital analysis data;
extracting selected analog analysis data from said analog portion of said circuit;
converting the selected analog analysis data into digital values;
inserting said digital values into said digital portion of said circuit;
extracting selected digital analysis data from said digital portion of said circuit;
converting the seeected digital analysis data into analog data; and
inserting said analog data into said analog portion of said circuit.

17. A method as claimed in claim 16, wherein said extracting selected analog analysis data from said analog portion of said circuit includes storing said selected analog analysis data in an array of analog values as a function of time, each analog value being associated with the time of its occurrence.

18. A method as claimed in claim 16, wherein said converting the selected analog analysis data into digital values includes determining the direction of a change in successive values of said selected analog analysis data as a function of time, and comparing said successive values with predetermined thereshold values for logic transitions in a first direction or in a second direction, as determined to define logic values.

19. A method as claimed in claim 18, further comprising storing said digital logic values in an array of digital logic values as a funciton of time, each digital logic value being associated with the time of transition in logic value.

20. A method as claimed in claim 16, wherein said providing analog analysis data of the analog portion of the circuit includes defining the rise and fall times of the analog waveforms.

21. A method as claimed in claim 20, wherein said converting the selected digital analysis data into analog data includes permitting changing of the defined rise and fall times.

22. A method as claimed in claim 20, further comprising determining whether time values associated with said analog analysis data are monotonically increasing with time.

23. A method as claimed in claim 22, wherein time is monotonically increasing whne the differences between each two succesive values of time are larger than one half the rise or fall time.

24. A method as claimed in claim 16, wherein said converting the selected digital analysis data into analog data includes generating the analog signals so that said analog signals are piecewise linear.

25. A method as claimed in claim 16, wherein said providing analog analysis data of the analog portion of the circuit includes defining increments of time and synchronizing said providing analog analysis data of the analog portion of the circuit and said providing digital analysis data of the digital portion of the circuit to perform analysis in accordance with the defined increments of time.

26. A method as claimed in claim 16, wherein said providing analog analysis data of the analog portion of the circuit includes providing at least transient analog analysis.

27. A method as claimed in claim 16, wherein said converting the selecting analog analysis data into digital values includes modelling the loading effect of inputs to the digital portion of the circuit on the analog analysis data.

28. A method as claimed in claim !6, said converting the selected digital analysis data into analog data includes modelling digital output impedance effect of devices modelled in said converting said selected digital analysis data into analog data to produce said digital analysis data.

* * * * *

UNITED STATES PATENT AND TRADEMARK OFFICE
CERTIFICATE OF CORRECTION

PATENT NO. : 4,792,913

DATED : December 20, 1988

INVENTOR(S) : DENNIS J. BUCKLAND ET AL

It is certified that error appears in the above-identified patent and that said Letters Patent is hereby corrected as shown below:

Title page, [56] OTHER PUBLICATIONS, lines 18 and 19, "Proc. IEEE ISACS" should be -- Proc. IEEE ISCAS --

Col. 3, line 9, "1." should be -- 1; --

Col. 4, line 32, "Referiing" should be -- Referring -- line 65, "takss" should be -- takes --

Col. 5, line 56, "nnd" should be -- and --

Col. 6, line 66, "represetts" should be -- represents --

Col. 7, line 62, "iccluding" should be -- including --

Col. 8, line 15, "voltageiis" should be -- voltage is -- line 27, "whichiis" should be -- which is -- line 49, "specffied" should be -- specified --

Col. 10, line 31, "hhe" should be -- the --

Col. 11, line 10, "required." should be -- required -- line 13, "convert" should be -- converts -- line 19, "automatical" should be -- automatically -- line 40, "prrtions" should be -- portions -- line 57, which is claim 1, "data" should be -- analysis data -- line 68, which is claim 1, "anaylsis" should be -- analysis --

Col. 12, line 50, which is claim 8, "meansccomprises" should be -- means comprises --

Col. 13, line 22, which is claim 16, "cicuit" should be -- circuit -- line 36, which is also claim 16, "seeected" should be -- selected --

UNITED STATES PATENT AND TRADEMARK OFFICE
CERTIFICATE OF CORRECTION

PATENT NO. : 4,792,913

DATED : December 20, 1988

INVENTOR(S) : DENNIS J. BUCKLAND ET AL

It is certified that error appears in the above-identified patent and that said Letters Patent is hereby corrected as shown below:

Col. 14, line 21, Claim 23, "whne" should be -- when -- line 45, Claim 28, "said" should be -- wherein said --.

Signed and Sealed this

Seventh Day of August, 1990

Attest:

HARRY F. MANBECK, JR.

*Attesting Officer*  *Commissioner of Patents and Trademarks*